United States Patent
Zhu

(10) Patent No.: US 12,520,514 B2
(45) Date of Patent: Jan. 6, 2026

(54) NANOWIRE/NANOSHEET DEVICE HAVING SELF-ALIGNED ISOLATION PORTION AND METHOD OF MANUFACTURING THE SAME, AND ELECTRONIC APPARATUS

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 400 days.

(21) Appl. No.: 18/044,090

(22) PCT Filed: Mar. 24, 2021

(86) PCT No.: PCT/CN2021/082731
§ 371 (c)(1),
(2) Date: Mar. 6, 2023

(87) PCT Pub. No.: WO2022/048135
PCT Pub. Date: Mar. 10, 2022

(65) Prior Publication Data
US 2023/0317838 A1    Oct. 5, 2023

(30) Foreign Application Priority Data
Sep. 7, 2020   (CN) .......................... 202010932062.1

(51) Int. Cl.
*H01L 29/775*   (2006.01)
*H01L 29/06*    (2006.01)
(Continued)

(52) U.S. Cl.
CPC ........... *H10D 30/43* (2025.01); *H10D 30/014* (2025.01); *H10D 30/6735* (2025.01);
(Continued)

(58) Field of Classification Search
CPC ................. H10D 30/014; H10D 30/43; H10D 30/6735; H10D 62/115; H10D 62/118;
(Continued)

(56) References Cited

U.S. PATENT DOCUMENTS 9,590,089 B2   3/2017   Rachmady et al.
9,780,200 B2   10/2017  Zhu
(Continued)

FOREIGN PATENT DOCUMENTS

CN    104054181 A    9/2014
CN    104681557 A    6/2015
(Continued)

OTHER PUBLICATIONS

First Office Action, including Search Report, for Chinese Patent Application No. 202010932062.1, dated Sep. 27, 2023, 17 pages.
(Continued)

*Primary Examiner* — David C Spalla
(74) *Attorney, Agent, or Firm* — Westman, Champlin & Koehler, P.A.

(57) ABSTRACT

A nanowire/nanosheet device having a self-aligned isolation portion and a method of manufacturing the same, and an electronic apparatus including the nanowire/nanosheet device are provided. According to embodiments, the nanowire/nanosheet device includes: a substrate; a nanowire/nanosheet spaced apart from a surface of the substrate and extending in a first direction; a gate stack extending in a second direction to surround the nanowire/nanosheet, where the second direction intersects the first direction; a spacer formed on a sidewall of the gate stack; source/drain layers at opposite ends of the nanowire/nanosheet in the first direction and adjoining the nanowire/nanosheet; and a first isolation portion between the gate stack and the substrate, where the first isolation portion is self-aligned with the gate stack.

24 Claims, 14 Drawing Sheets

(51) Int. Cl.
- *H01L 29/423* (2006.01)
- *H01L 29/66* (2006.01)
- *H10D 30/01* (2025.01)
- *H10D 30/43* (2025.01)
- *H10D 30/67* (2025.01)
- *H10D 62/10* (2025.01)
- *H10D 64/01* (2025.01)

(52) U.S. Cl.
CPC ......... *H10D 62/115* (2025.01); *H10D 62/121* (2025.01); *H10D 64/017* (2025.01); *H10D 64/018* (2025.01)

(58) Field of Classification Search
CPC ............... H10D 62/119; H10D 62/121; H10D 64/015; H10D 64/017; H10D 64/018; H10D 64/021
See application file for complete search history.

(56) References Cited

U.S. PATENT DOCUMENTS

| | | | |
|---|---|---|---|
| 10,038,054 | B2 | 7/2018 | Rachmady et al. |
| 10,103,238 | B1 | 10/2018 | Zang et al. |
| 11,018,222 | B1* | 5/2021 | O'Brien ................. B82B 1/008 |
| 2013/0341704 | A1* | 12/2013 | Rachmady ........ H01L 21/02603 977/890 |
| 2016/0071931 | A1 | 3/2016 | Cheng et al. |
| 2016/0268392 | A1 | 9/2016 | Zhu |
| 2017/0154960 | A1 | 6/2017 | Rachmady et al. |
| 2018/0374761 | A1 | 12/2018 | Guillorn et al. |
| 2019/0097011 | A1* | 3/2019 | Wu ........................ H10D 84/85 |
| 2020/0066894 | A1 | 2/2020 | Frougier et al. |
| 2020/0083219 | A1 | 3/2020 | Kang et al. |
| 2020/0105869 | A1* | 4/2020 | Loubet ................. H10D 62/151 |
| 2020/0227305 | A1* | 7/2020 | Cheng ................. H10D 30/6735 |
| 2020/0279918 | A1 | 9/2020 | Wu et al. |
| 2021/0320210 | A1* | 10/2021 | Lin .................... H10D 30/6757 |

FOREIGN PATENT DOCUMENTS

| | | |
|---|---|---|
| CN | 105609421 A | 5/2016 |
| CN | 109244139 A | 1/2019 |
| CN | 112018184 A | 12/2020 |
| CN | 112018186 A | 12/2020 |

OTHER PUBLICATIONS

International Search Report and Written Opinion for International Application No. PCT/CN2021/082731, dated Jun. 11, 2021.

Extended European Search Report for European Application No. 21863206.5 issued Sep. 12, 2024.

English Translation of Korean Office Action for Korean Application No. 10-2023-7011791, issued Aug. 13, 2024.

* cited by examiner

NANOWIRE/NANOSHEET DEVICE HAVING SELF-ALIGNED ISOLATION PORTION AND METHOD OF MANUFACTURING THE SAME, AND ELECTRONIC APPARATUS

CROSS REFERENCE TO RELATED APPLICATION(S)

This application is a Section 371 National Stage Application of International Application No. PCT/CN2021/082731, filed on Mar. 24, 2021, entitled "NANOWIRE/NANOSHEET DEVICE HAVING SELF-ALIGNED ISOLATION PORTION AND METHOD OF MANUFACTURING THE SAME, AND ELECTRONIC APPARATUS" which published as WIPO Publication No. 2022/048135 A1, filed on Mar. 10, 2022, not in English, which claims priority to Chinese Patent Application No. 202010932062.1, filed on Sep. 7, 2020, the contents of which are incorporated herein by reference in their entireties.

TECHNICAL FIELD

The present disclosure relates to a field of semiconductor technology, and in particular, to a nanowire/nanosheet device having a self-aligned isolation portion, a method of manufacturing the nanowire/nanosheet device, and an electronic apparatus including the nanowire/nanosheet device.

BACKGROUND

A nanowire or nanosheet (hereinafter referred to as "nanowire/nanosheet") device, especially a nanowire/nanosheet-based Gate-All-Around (GAA) Metal Oxide Semiconductor Field Effect Transistor (MOSFET), may control a short channel effect well and achieve a further miniaturization of the device. However, with an increasing miniaturization, it is difficult to make a good isolation portion between a gate and a substrate below the nanowire/nanosheet, which may result in a large overlapping capacitance between the gate and the substrate.

SUMMARY

In view of this, an objective of the present disclosure is, at least in part, to provide a nanowire/nanosheet device having a self-aligned isolation portion, a method of manufacturing the nanowire/nanosheet device, and an electronic apparatus including the nanowire/nanosheet device.

According to an aspect of the present disclosure, a nanowire/nanosheet device is provided, including: a substrate; a nanowire/nanosheet spaced apart from a surface of the substrate and extending in a first direction; a gate stack extending in a second direction to surround the nanowire/nanosheet, where the second direction intersects the first direction; a spacer formed on a sidewall of the gate stack; source/drain layers at opposite ends of the nanowire/nanosheet in the first direction and adjoining the nanowire/nanosheet; and a first isolation portion between the gate stack and the substrate, where the first isolation portion is self-aligned with the gate stack.

According to another aspect of the present disclosure, a method of manufacturing a nanowire/nanosheet device is provided, including: forming an isolation portion defining layer on a substrate; providing a nanowire/nanosheet on the isolation portion defining layer, where the nanowire/nanosheet extends in a first direction and is spaced apart from the isolation portion defining layer; patterning the isolation portion defining layer into a shape self-aligned with the nanowire/nanosheet; forming a dummy gate on the substrate, where the dummy gate extends in a second direction intersecting the first direction and surrounds the nanowire/nanosheet; forming a spacer on a sidewall of the dummy gate; replacing the isolation portion defining layer with a first isolation portion; and removing the dummy gate, and forming, on an inner side of the spacer, a gate stack in a gate trench formed by a removal of the dummy gate.

According to another aspect of the present disclosure, an electronic apparatus is provided, including the nanowire/nanosheet device as described above.

According to embodiments of the present disclosure, the self-aligned isolation portion may be formed below the gate. In addition, a thickness of the isolation portion may be easily adjusted, and thus electrical characteristics of the device, such as a reliability and a capacitance, may be optimized.

BRIEF DESCRIPTION OF THE DRAWINGS

The above and other objectives, features, and advantages of the present disclosure will be clearer through the following descriptions of embodiments of the present disclosure with reference to accompanying drawings, wherein:

FIG. 1 to FIG. 15(b) schematically show some stages in a process of manufacturing a nanowire/nanosheet device according to embodiments of the present disclosure, and wherein FIG. 1, FIG. 3(a), FIG. 4(a), FIG. 5(b), FIG. 6, FIG. 7, FIG. 8(a), FIG. 9(a), FIG. 9(b), FIG. 10(a), FIG. 10(c), FIG. 11(a), FIG. 12(a), FIG. 13(a), FIG. 14(a) and FIG. 15(a) are cross-sectional views taken along line AA', FIG. 3(b), FIG. 4(b), FIG. 8(b), FIG. 10(b), FIG. 11(b), FIG. 12(b), FIG. 13(b), FIG. 14(b) and FIG. 15(b) are cross-sectional views taken along line BB'.

DETAILED DESCRIPTION OF EMBODIMENTS

Figure 1:
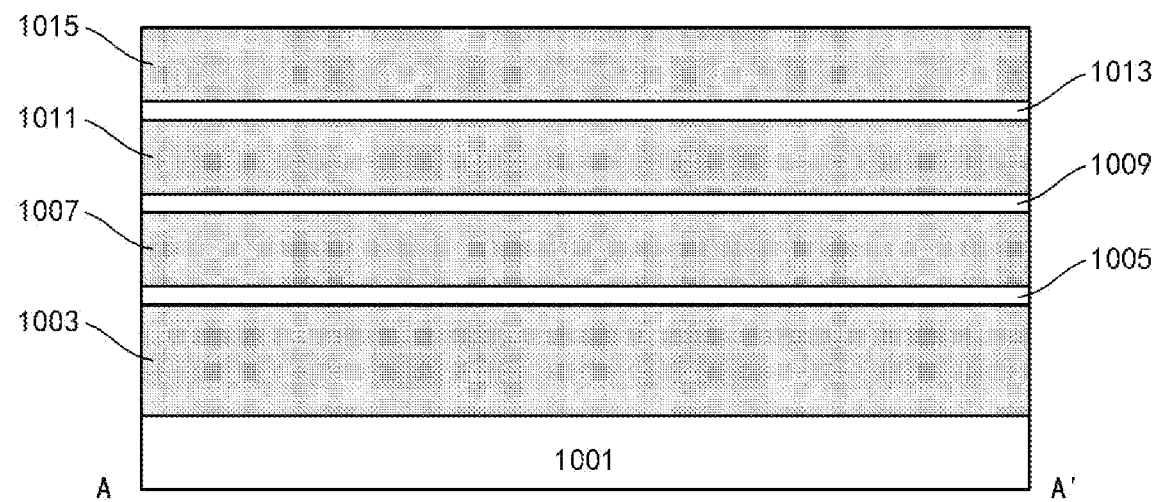

Embodiments of the present disclosure will be described below with reference to the accompanying drawings. It should be understood, however, that these descriptions are merely exemplary and are not intended to limit the scope of the present disclosure. In addition, in the following descriptions, descriptions of well-known structures and technologies are omitted to avoid unnecessarily obscuring the concept of the present disclosure.

Various schematic structural diagrams according to the embodiments of the present disclosure are shown in the accompanying drawings. The drawings are not drawn to scale. Some details are enlarged and some details may be omitted for clarity of presentation. Shapes of various regions and layers as well as a relative size and a positional relationship thereof shown in the drawings are only exemplary. In practice, there may be deviations due to manufacturing tolerances or technical limitations, and those skilled in the art may additionally design regions/layers with different shapes, sizes, and relative positions according to actual needs. In the context of the present disclosure, when a layer/element is referred to as being located "on" another layer/element, the layer/element may be directly on the another layer/element, or there may be an intermediate layer/element therebetween. In addition, if a layer/element is located "on" another layer/element in one orientation, the layer/element may be located "under" the another layer/element when the orientation is reversed.

According to embodiments of the present disclosure, a nanowire/nanosheet device is provided. Specifically, the device may include at least one nanowire or nanosheet used as a channel. The nanowire/nanosheet may be suspended relative to a substrate and may extend substantially parallel to a surface of the substrate. Nanowires/nanosheets are aligned with each other in a vertical direction (e.g., a direction substantially perpendicular to the surface of the substrate). The nanowire/nanosheet may extend in a first direction, and may adjoin source/drain layers at opposite ends in the first direction. The source/drain layer may include a semiconductor material different from that of the nanowire/nanosheet in order to achieve stress engineering. In addition, a gate stack may extend in a second direction intersecting (e.g., perpendicular to) the first direction so as to intersect each nanowire/nanosheet, and thus may surround a periphery of each nanowire/nanosheet, so that a Gate-All-Around (GAA) structure may be formed.

An isolation portion may be provided between the gate stack and the substrate. For example, the isolation portion may include a first isolation portion substantially aligned with the nanowire/nanosheet in the vertical direction and a second isolation portion adjoining the first isolation portion on opposite sides of the first isolation portion in the second direction. According to embodiments of the present disclosure, at least one of the first isolation portion and the second isolation portion may be self-aligned with the gate stack. The first isolation portion and the second isolation portion may together extend under the gate stack along the second direction.

The extent of the first isolation portion in the first direction and the extent of the first isolation portion in the second direction may be defined by the nanowire/nanosheet above. For example, the first isolation portion may be substantially center-aligned with the nanowire/nanosheet. In addition, at least part of each sidewall of the first isolation portion (in the first direction and the second direction) may be substantially aligned or coplanar with a corresponding sidewall of the gate stack in the vertical direction, and other portions of the sidewall may not be coplanar with the corresponding sidewall of the gate stack, but may still maintain a substantially conformal extension.

Such a semiconductor device may be manufactured as follows, for example. An isolation portion defining layer may be provided on the substrate, and the nanowire/nanosheet extending in the first direction and spaced apart from the isolation portion defining layer may be provided on the isolation portion defining layer. The isolation portion defining layer may be patterned into a shape self-aligned with the nanowire/nanosheet, which may be achieved by etching the isolation portion defining layer by using the nanowire/nanosheet (or a (hard) mask used to form the nanowire/nanosheet) as a mask. After that, a self-aligned isolation portion (referred to as "first isolation portion") may be formed by replacing the isolation portion defining layer with a dielectric material. In addition, a dummy gate extending in the second direction intersecting (e.g., perpendicular to) the first direction to surround the nanowire/nanosheet may be formed, and a spacer may be formed on a sidewall of the dummy gate. The dummy gate may be replaced with the gate stack by a replacement gate process.

In order to provide the nanowire/nanosheet, a stack of one or more gate defining layers and one or more nanowire/nanosheet defining layers alternately arranged may be formed on the isolation portion defining layer. The stack may be patterned as a preliminary nanowire/nanosheet extending in the first direction. A length of the preliminary nanowire/nanosheet in the first direction may be greater than a length of a nanowire/nanosheet finally formed in the first direction, so as to subsequently form the nanowire/nanosheet self-aligned with the dummy gate. In the patterning step, the isolation portion defining layer may also be patterned. Therefore, the isolation portion defining layer may be self-aligned with the preliminary nanowire/nanosheet. So far, the gate defining layer may also be in a shape of nanowire/nanosheet. In order to form the gate-all-around, another gate defining layer may also be formed, and the another gate defining layer may be patterned into a strip shape extending in the second direction. The underlying preliminary nanowire/nanosheet may be patterned by using the strip-shaped another gate defining layer as a mask. Therefore, the strip-shaped another gate defining layer may form the dummy gate extending in the second direction together with other gate defining layers. The nanowire/nanosheet defining layer is patterned into the nanowire/nanosheet self-aligned with the dummy gate, and the nanowire/nanosheet is surrounded by the dummy gate. In the patterning step, the isolation portion defining layer may also be patterned. Therefore, the isolation portion defining layer may be self-aligned with the nanowire/nanosheet.

In order to form a self-aligned spacer, the dummy gate may be selectively etched, so that a sidewall of the dummy gate may be recessed inward relative to a sidewall of the nanowire/nanosheet, and the spacer may be formed in the recess thus formed.

In addition, after the preliminary nanowire/nanosheet is formed, a second isolation portion may be formed around the preliminary nanowire/nanosheet. Therefore, the isolation portion defining layer may adjoin the second isolation portion on opposite sides of the isolation portion defining layer in the second direction. In this way, the first isolation portion, which replaces the isolation portion defining layer, may extend under the dummy gate (or the gate stack replacing the dummy gate) together with the second isolation portion, so as to isolate the gate stack from the substrate.

The present disclosure may be presented in various forms, some examples of which will be described below. In the following descriptions, a selection of various materials is involved. In the selection of the material, in addition to a function of the material (for example, a semiconductor material may be used for forming an active region, a dielectric material may be used for forming an electrical isolation), an etching selectivity also needs to be considered. In the following descriptions, a required etching selectivity may or may not be indicated. It should be clear to those skilled in the art that when etching a material layer is mentioned below, if it is not mentioned or shown that other layers are also etched, the etching may be selective, and the material layer may have etching selectivity relative to other layers exposed to the same etching formula.

FIG. 1 to FIG. 15(b) schematically show some stages in a process of manufacturing a semiconductor device according to embodiments of the present disclosure.

As shown in FIG. 1, a substrate 1001 is provided. The substrate 1001 may be in various forms, including but not limited to a bulk semiconductor material substrate such as a bulk Si substrate, a semiconductor-on-insulator (SOI) substrate, a compound semiconductor substrate such as a SiGe substrate, and the like. In the following descriptions, for ease of explanation, a bulk Si substrate is taken as an example for description. Here, a silicon wafer is provided as the substrate 1001.

An isolation portion defining layer 1003 may be formed on the substrate 1001 to define a position of a (first) isolation portion to be formed subsequently. An etch stop layer 1005 may be formed on the isolation portion defining layer 1003. The etch stop layer 1005 may be used to define a stop position when etching the isolation portion defining layer 1003 subsequently, especially no etching selectivity or a low etching selectivity exists between the isolation portion defining layer 1003 and a gate defining layer (e.g., 1007) subsequently formed. Alternatively, the etch stop layer 1005 may be omitted in a case that the etching selectivity exists between the isolation portion defining layer 1003 and the gate defining layer subsequently formed.

A stack of gate defining layers 1007, 1011, 1015 and nanowire/nanosheet defining layers 1009, 1013 alternately arranged may be formed on the etch stop layer 1005. The gate defining layers 1007, 1011 and 1015 may define a position of a gate stack to be formed subsequently, and the nanowire/nanosheet defining layers 1009, 1013 may define a position of a nanowire/nanosheet to be formed subsequently. In the stack, an uppermost layer may be the gate defining layer 1015, so that each of the nanowire/nanosheet defining layers 1009, 1013 is covered above and below by the gate defining layers, so as to subsequently form a gate-all-around configuration. In the example, two nanowire/nanosheet defining layers 1009, 1013 may be formed, and thus two nanowires/nanosheets are formed in a final device. However, the present disclosure is not limited to this. The number of nanowire/nanosheet defining layers to be formed may be determined according to the number (which may be one or more) of nanowires/nanosheets to be finally formed, and the number of gate defining layers to be formed may be determined accordingly.

The isolation portion defining layer 1003, the etch stop layer 1005, the gate defining layers 1007, 1011, 1015, and the nanowire/nanosheet defining layers 1009, 1013 may be semiconductor layers formed on the substrate 1001 by, for example, an epitaxial growth. Therefore, the nanowire/nanosheet defining layers 1009, 1013 may have a good crystal quality and may be of a single crystal structure, so as to subsequently provide a single crystal nanowire/nanosheet used as a channel. Adjacent semiconductor layers among the semiconductor layers may have etching selectivity, so as to be subsequently processed separately. For example, the etch stop layer 1005 and the nanowire/nanosheet defining layers 1009, 1013 may contain Si, and the isolation portion defining layer 1003 and the gate defining layers 1007, 1011 and 1015 may contain SiGe (an atomic percentage of Ge is in a range of, for example, about 10% to 40%, and may be gradually changed to reduce defectivity). Each semiconductor layer may have a substantially uniform thickness, so as to extend substantially parallel to a surface of the substrate 1001. For example, a thickness of the isolation portion defining layer 1003 may be in a range of about 30 nm to 80 nm, a thickness of the etch stop layer 1005 may be in a range of about 3 nm to 15 nm, a thickness of the gate defining layers 1007, 1011 and 1015 may be in a range of about 20 nm to 40 nm, and a thickness of the nanowire/nanosheet defining layers 1009, 1013 may be in a range of about 5 nm to 15 nm.

Figure 2A:
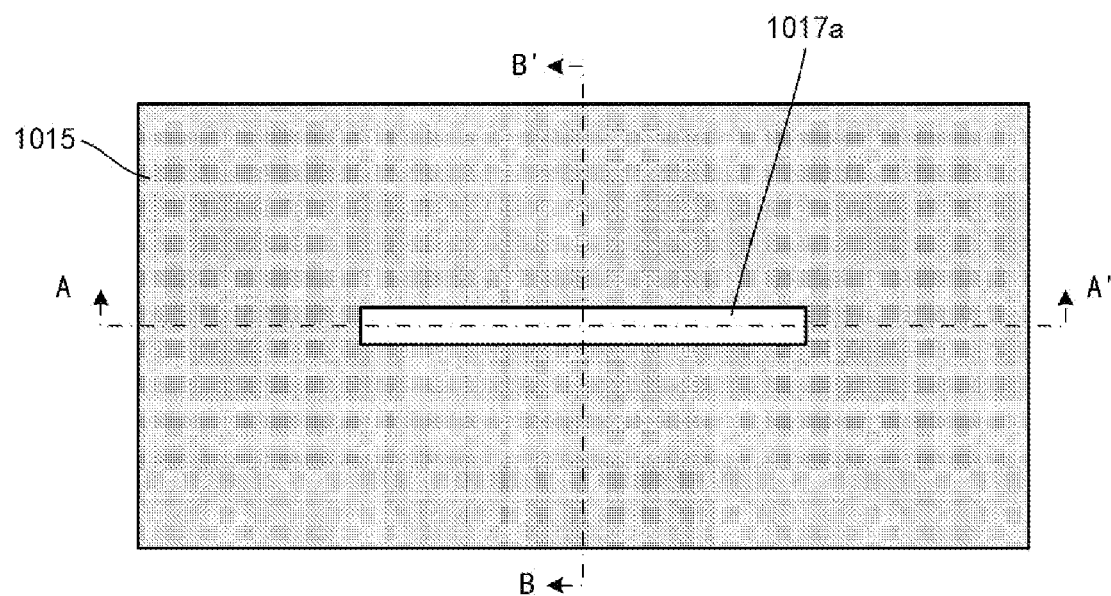
FIG. 2(a), FIG. 2(b) and FIG. 5(a) are top views, and positions of lines AA' and BB' are shown in FIG. 2(a).
Figure 2B:
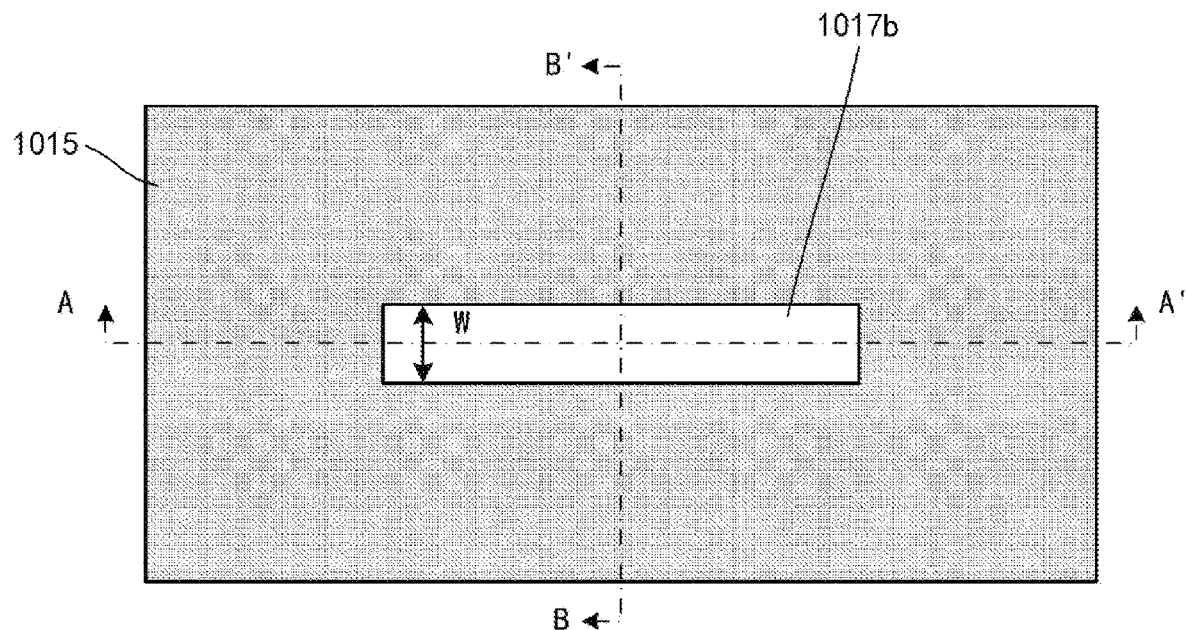
Figure 3A:
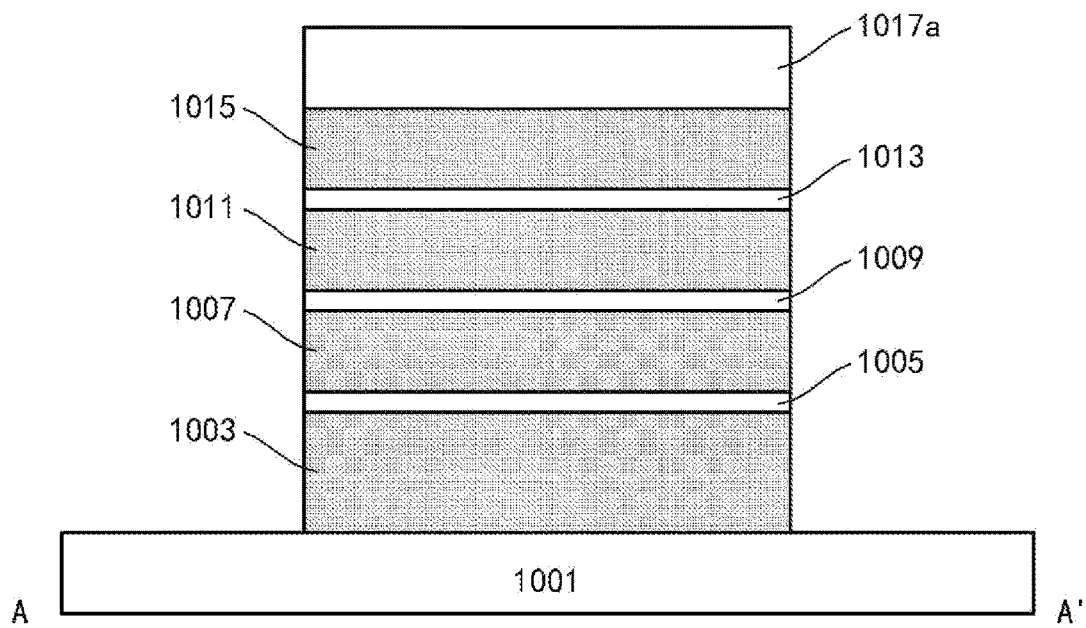
Figure 3B:
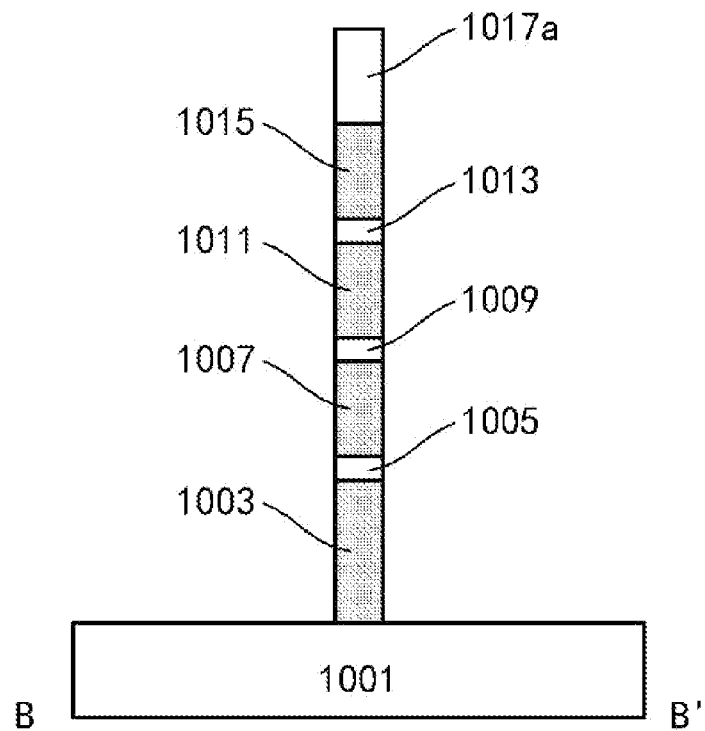

Next, the nanowire/nanosheet may be patterned. For example, as shown in FIG. 2(a) and FIG. 2(b), a mask such as a photoresist 1017a or 1017b may be formed on the above-mentioned stack, and the photoresist 1017a or 1017b may be patterned into a form of a nanowire (FIG. 2(a)) or nanosheet (FIG. 2(b)) by photolithography. For the nanosheet, a width W of the nanosheet may determine a device width with which the device provides a current. In the following descriptions, the nanowire is mainly taken as an example, but the descriptions may also be applied to the nanosheet. Then, as shown in FIG. 3(a) and FIG. 3(b), various layers on the substrate 1001 may be selectively etched sequentially by, for example, Reactive Ion Etching (RIE), with the photoresist 1017a or 1017b as a mask, and the etching may stop at the substrate 1001. In this way, the layers on the substrate 1001 are patterned as a preliminary nanowire or nanosheet corresponding to the photoresist 1017a or 1017b. Here, a length (a longitudinal dimension, that is, a length in a horizontal direction in an orientation shown in FIG. 3(a)) of the preliminary nanowire/nanosheet may be less than a length of a nanowire/nanosheet to be formed for use as a channel, so that the nanowire/nanosheet self-aligned with the dummy gate (gate stack) may be subsequently obtained to be used as a channel. After that, the photoresist 1017a or 1017b may be removed.

Figure 4A:
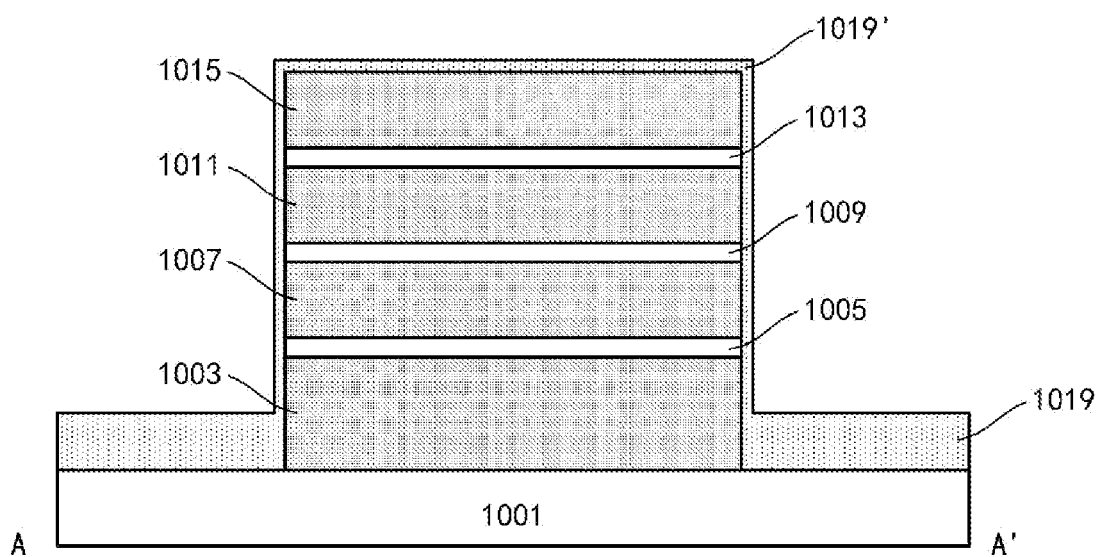
Figure 4B:
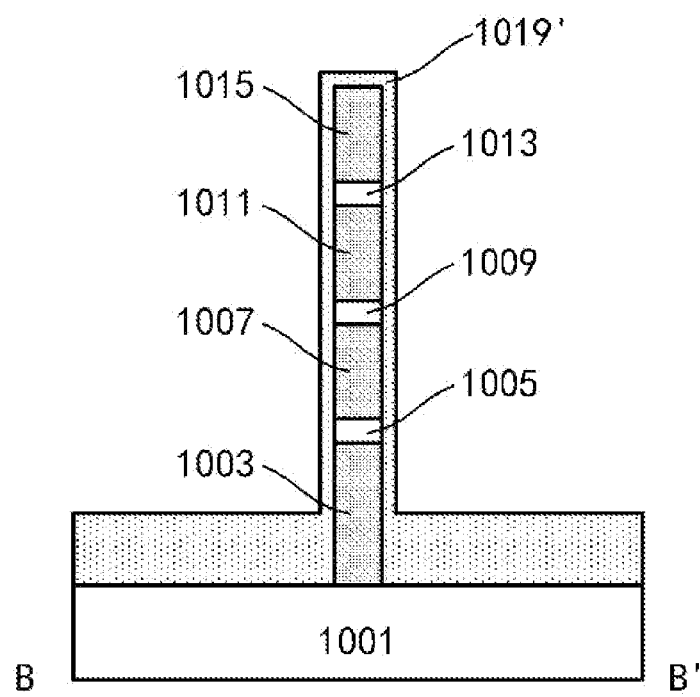

For the purpose of electrical isolation, as shown in FIG. 4(a) and FIG. 4(b), a (second) isolation portion 1019, such as a Shallow Trench Isolation (STI), may be formed on the substrate 1001. For example, the STI 1019 may be formed by depositing an oxide (e.g., silicon oxide) on the substrate, performing a planarization process such as Chemical Mechanical Polishing (CMP) on the deposited oxide, and etching back the planarized oxide by, for example, a wet etching or a vapor phase etching or a dry etching. In addition, a thin etch stop layer 1019' (e.g., with a thickness in a range of about 1 nm to 5 nm) may be formed on a surface of the semiconductor layer that has been patterned into the nanowire/nanosheet form on the substrate 1001 by, for example, deposition. Here, the etch stop layer 1019' may also contain an oxide, and is thus shown as a thin layer integral with the STI 1019.

Figure 5A:
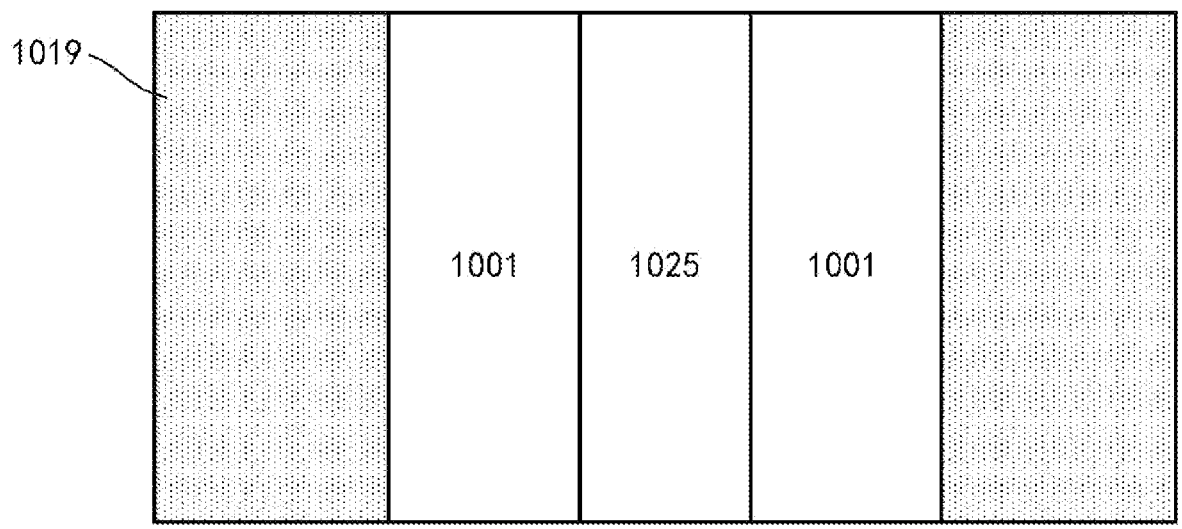
Figure 5B:
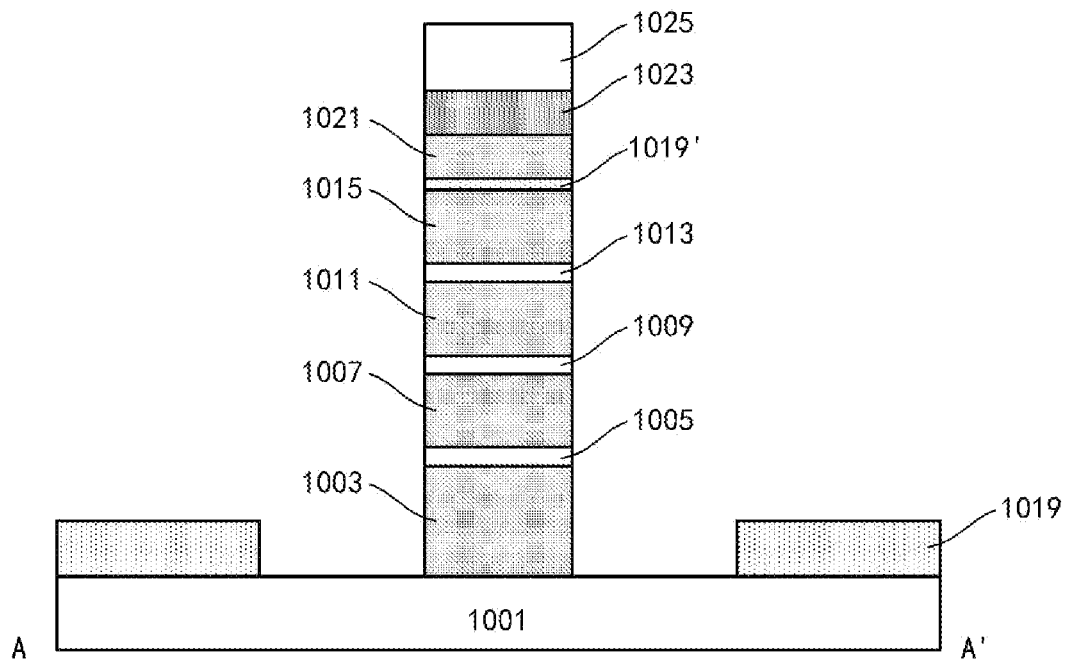

As described above, the gate defining layers 1007, 1011, 1015 are located on upper and lower sides of the nanowire/nanosheet defining layers 1009, 1013. In order to form the gate-all-around, another gate defining layer may be formed on left and right sides in an orientation shown in FIG. 4(b). For example, as shown in FIG. 5(a) and FIG. 5(b), a gate defining layer 1021 may be formed on the STI 1019 and the etch stop layer 1019'. For example, the gate defining layer 1021 may be formed by depositing substantially the same material as or similar material to that of the gate defining layers 1007, 1011, 1015 (thereby having substantially the same or similar etching selectivity, so as to be processed together), and performing a planarization processing such as CMP on the deposited material. In the example, the gate defining layer 1021 may contain SiGe with an atomic percentage of Ge substantially the same as or similar to that of the gate defining layers 1007, 1011, 1015.

A hard mask layer 1023 may be formed on the gate defining layer 1021 by, for example, deposition, to facilitate patterning. For example, the hard mask layer 1023 may contain a nitride (e.g., silicon nitride).

The gate defining layers 1007, 1011, 1015, 1021 may be patterned as a dummy gate extending in a direction (e.g., a vertical direction in FIG. 5(a), and a direction perpendicular to a paper surface in FIG. 5(b)) intersecting (e.g., perpendicular to) an extension direction (e.g., a horizontal direction in FIG. 5(a) and FIG. 5(b)) of the preliminary nanowire/nanosheet. For example, a photoresist 1025 may be formed on the hard mask layer 1023, and the photoresist 1025 may be patterned into a strip shape extending in the direction by photolithography. Then, the layers between the STIs 1019 on the substrate 1001 may be selectively etched in sequence by, for example, RIE, with the photoresist 1025 as a mask, and the etching may stop at the substrate 1001. As a result, the nanowire/nanosheet defining layers 1009, 1013 are formed as nanowires or nanosheets subsequently used to provide channels (the nanowire/nanosheet defining layers 1009, 1013 are referred to as nanowires/nanosheets 1009, 1013 below), and are surrounded by the gate defining layers 1007, 1011, 1015, 1021 (which may be collectively referred to as "dummy gate"). The nanowires/nanosheets 1009, 1013 may be self-aligned with the dummy gate. After that, the photoresist 1025 may be removed.

In addition, as shown in FIG. 5(b), the surface of the substrate 1001 on both sides of the dummy gate is exposed, and the exposed surface may facilitate a subsequent growth of the source/drain layers. In addition, the STI 1019 may adjoin the isolation portion defining layer 1003 on opposite sides of the isolation portion defining layer 1003 in an extension direction (a direction perpendicular to the paper surface in the drawing) of the dummy gate, and may extend in self-alignment with the dummy gate (referring to FIG. 8(b)).

Figure 6:
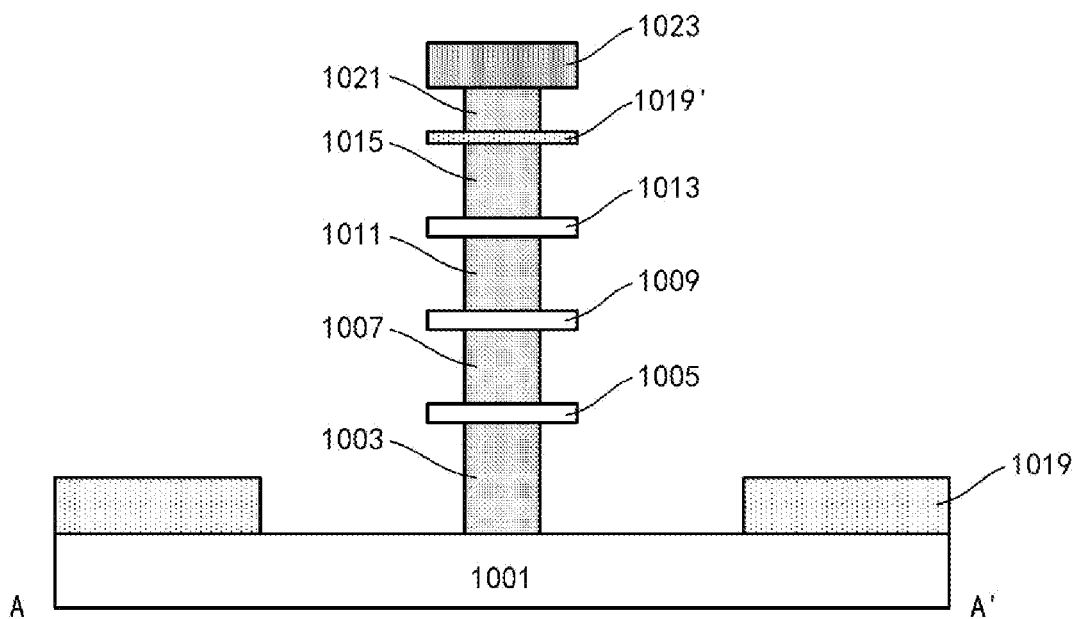

In consideration of a limitation of a gate space and an isolation between the gate and the source/drain, a spacer may be formed on a sidewall of the dummy gate. In order to ensure identical gate lengths above and below the nanowires/nanosheets 1009, 1013, the spacer may be formed by using a self-alignment technology. For example, as shown in FIG. 6, the gate defining layers 1007, 1011, 1015, 1021 (SiGe in the example) may be selectively etched relative to the nanowires/nanosheets 1009, 1013 (Si in the example), so that sidewalls of the gate defining layers 1007, 1011, 1015, 1021 are recessed inward by a certain depth relative to a sidewall of the hard mask layer 1023 or sidewalls of the nanowires/nanosheets 1009, 1013. Preferably, recessed depths of the gate defining layers 1007, 1011, 1015, 1021 are substantially identical to each other, and recessed depths at left and right sides are substantially identical to each other. For example, a good etch control may be achieved by using an Atomic Layer Etching (ALE). In the example, the isolation portion defining layer 1003 may also contain SiGe, and therefore may also be recessed by substantially the same depth. Accordingly, corresponding sidewalls of the etched gate defining layers 1007, 1011, 1015, 1021 (and isolation portion defining layer 1003) may be substantially coplanar.

Figure 7:
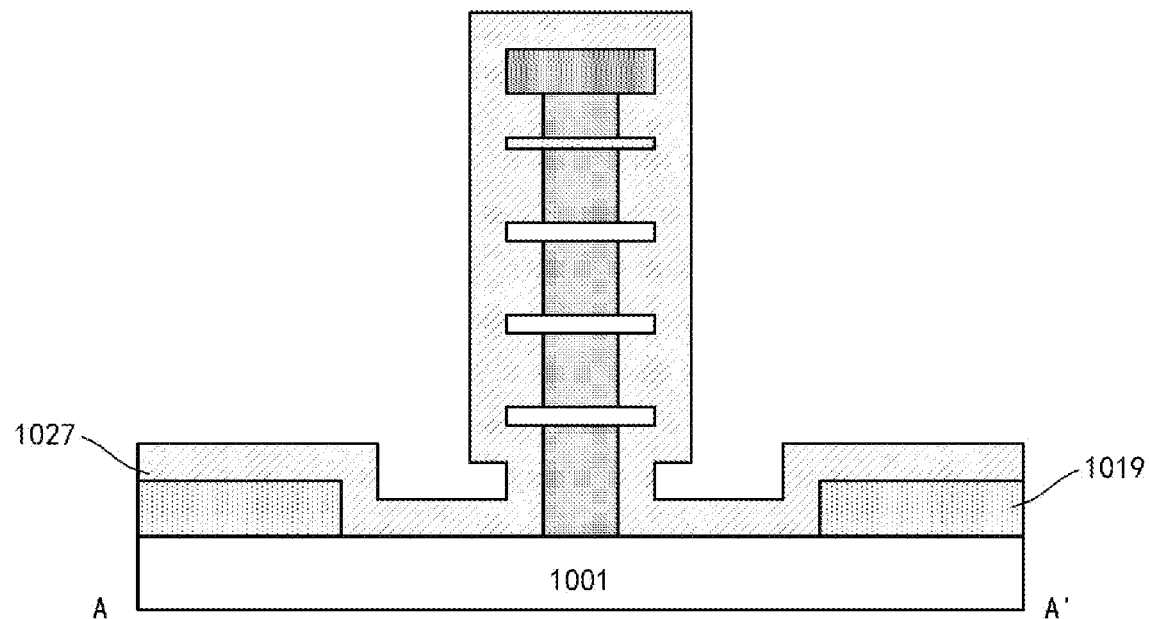

A spacer may be formed in the recess thus formed. As shown in FIG. 7, a dielectric material layer 1027 of a certain thickness may be formed on the substrate 1001 by, for example, deposition. A thickness of the deposited dielectric material layer 1027 may be in a range of, for example, about 3 nm to 15 nm, which is sufficient to fill the above-mentioned recess. For example, the dielectric material layer 1027 may contain SiC, etc.

Figure 8A:
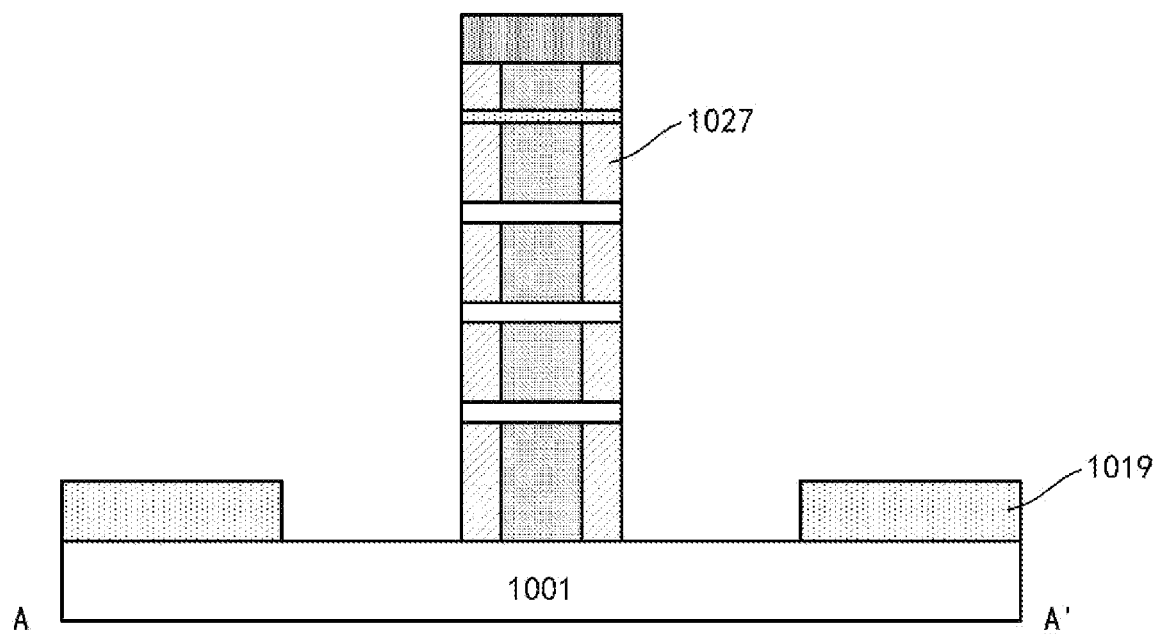
Figure 8B:
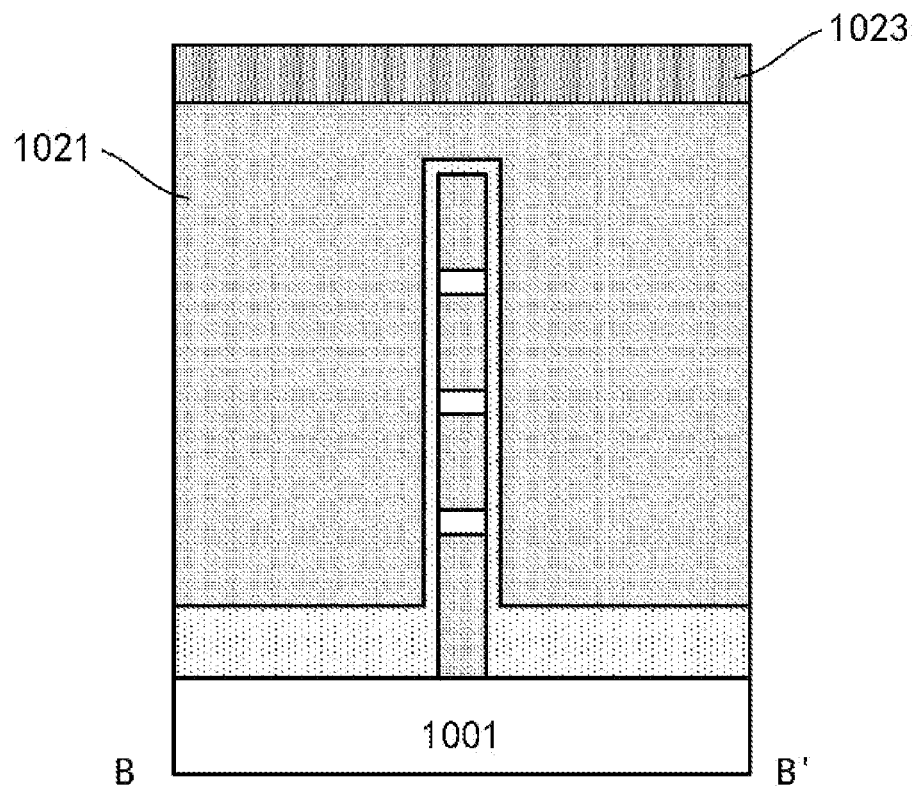

After that, as shown in FIG. 8(a) and FIG. 8(b), a lateral extension of the dielectric material layer 1027 may be removed by, for example, RIE in the vertical direction, and a vertical extension (including a portion below the hard mask layer 1023) of the dielectric material layer 1027 may be left, so that a spacer 1027 may be formed. A sidewall of the spacer 1027 may be substantially coplanar with the sidewall of the hard mask layer 1023 (and the sidewalls of the nanowires/nanosheets 1009, 1013).

Figure 9A:
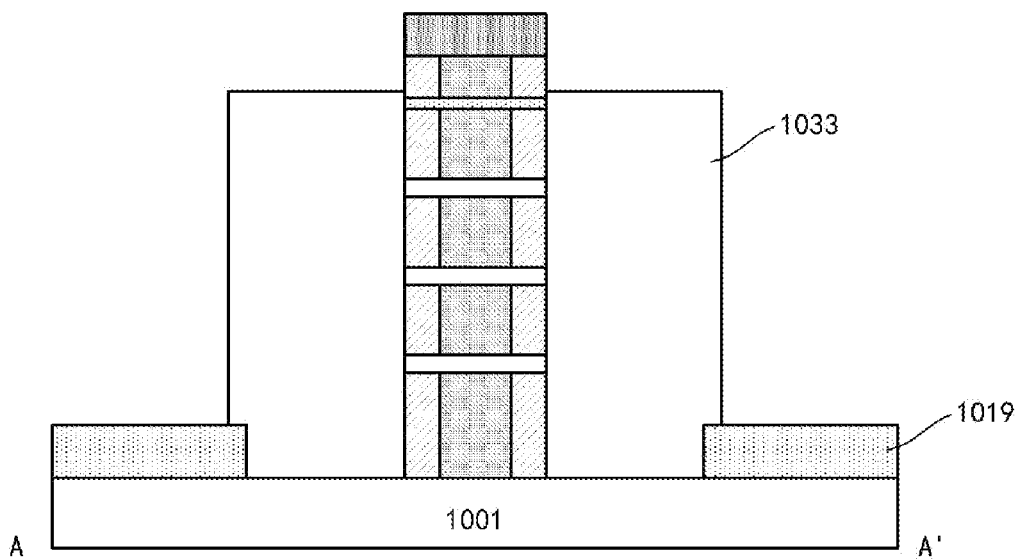
Figure 9B:
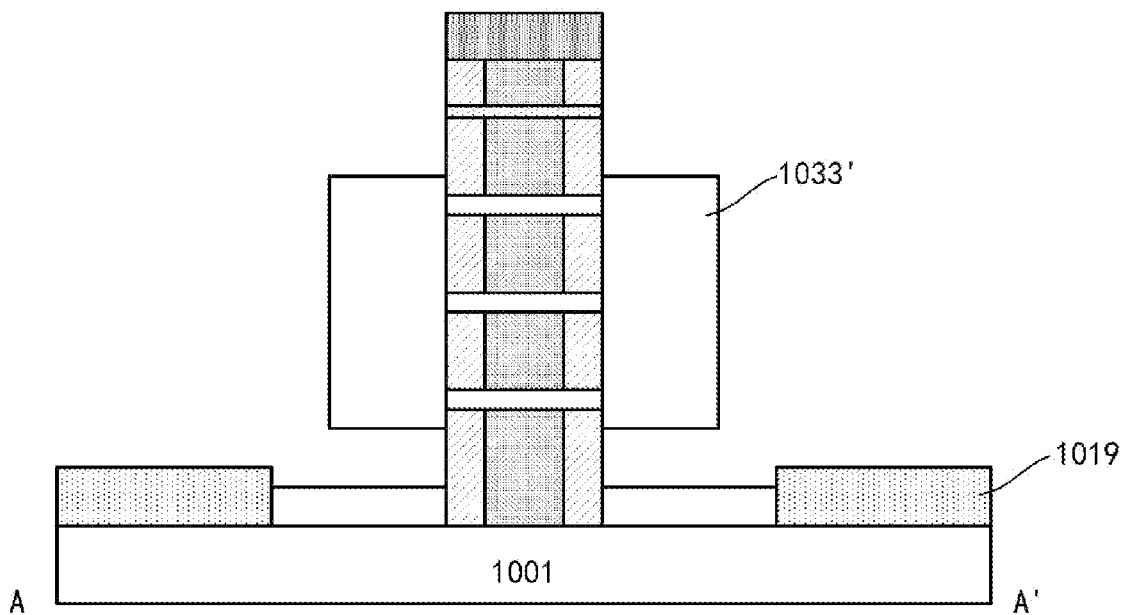

As shown in FIG. 8(a) and FIG. 8(b), the sidewall of each nanowire/nanosheet is exposed to the outside (and may be substantially coplanar with the sidewall of the hard mask layer) in a direction (a horizontal direction in FIG. 8(a)) intersecting (e.g., perpendicular to) an extension direction (a direction perpendicular to a paper surface in FIG. 8(a)) of the dummy gate. As shown in FIG. 9(a) and FIG. 9(b), a source/drain layer 1033 may be formed by, for example, selective epitaxial growth, with the exposed sidewall of the nanowire/nanosheet (and the exposed surface of the substrate 1001) as a seed. The source/drain layer 1033 may be formed to adjoin the exposed sidewalls of all nanowires/nanosheets. The source/drain layer 1033 may contain various suitable semiconductor materials. In order to enhance a device performance, the source/drain layer 1033 may contain a semiconductor material having a lattice constant different from that of the nanowire/nanosheet, so as to apply a stress to the nanowire/nanosheet in which a channel region is to be formed. For example, for an n-type device, the source/drain layer 1033 may contain Si: C (an atomic percentage of C may be in a range of, for example, about 0.1% to 3%) to apply a tensile stress; for a p-type device, the source/drain layer 1033 may contain SiGe (an atomic percentage of Ge may be in a range of, for example, about 20% to 80%) to apply a compressive stress. In addition, the source/drain layer 1033 may be doped to a desired conductive type (n-type doping for the n-type device and p-type doping for the p-type device) by, for example, in situ doping or ion implantation.

In the embodiment shown in FIG. 9(a), a source/drain layer grown from the sidewall of the nanowire/nanosheet adjoins a source/drain layer grown from the surface of the substrate 1001, which may facilitate a heat dissipation or an enhancement of a stress in the channel so as to improve the device performance. In addition, in the embodiment shown in FIG. 9(b), a source/drain layer 1033' grown from the sidewall of the nanowire/nanosheet is spaced apart from the source/drain layer grown from the surface of the substrate 1001. The case shown in FIG. 9(a) will be mainly described below as an example.

Next, a replacement gate process may be performed.

Figure 10A:
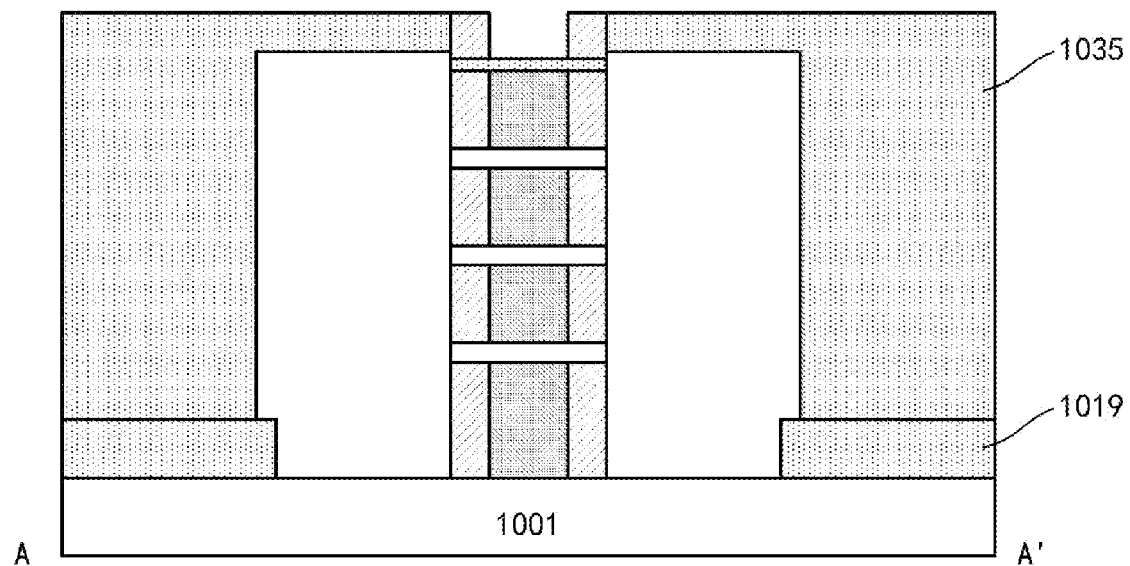
Figure 10B:
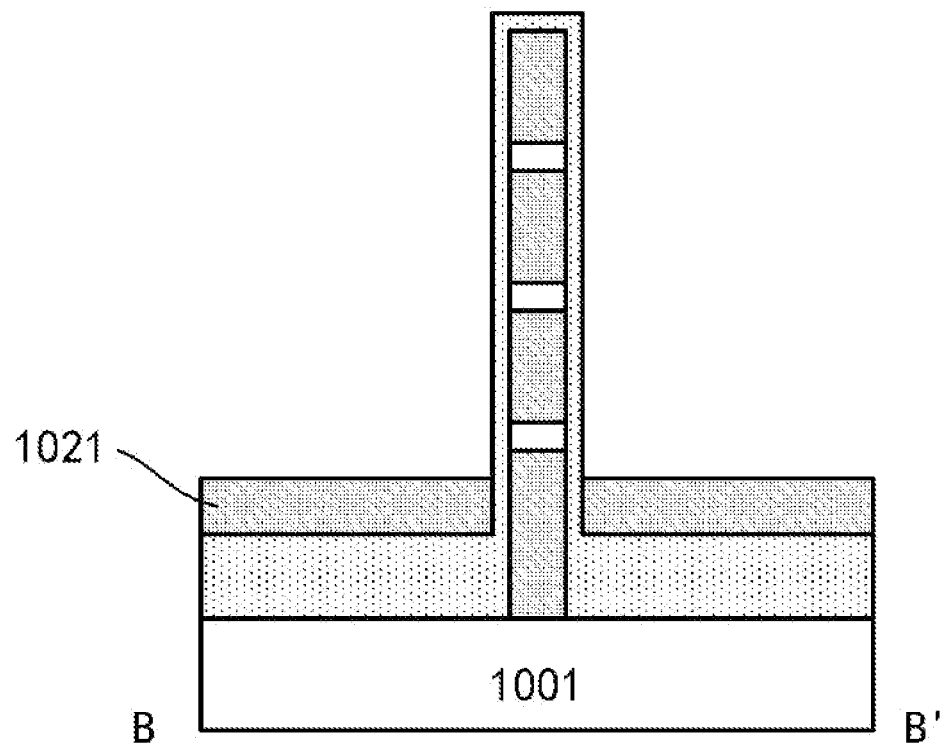

For example, as shown in FIG. 10(a) and FIG. 10(b), an interlayer dielectric layer 1035 may be formed on the substrate 1001. For example, the interlayer dielectric layer 1035 may be formed by depositing an oxide, performing a planarization process such as CMP on the deposited oxide, and etching back the planarized oxide. The interlayer dielectric layer 1035 may expose the hard mask layer 1023 while covering the source/drain layer 1033. After that, the hard mask layer 1023 may be removed by selective etching, so as to expose the gate defining layer 1021.

Figure 10C:
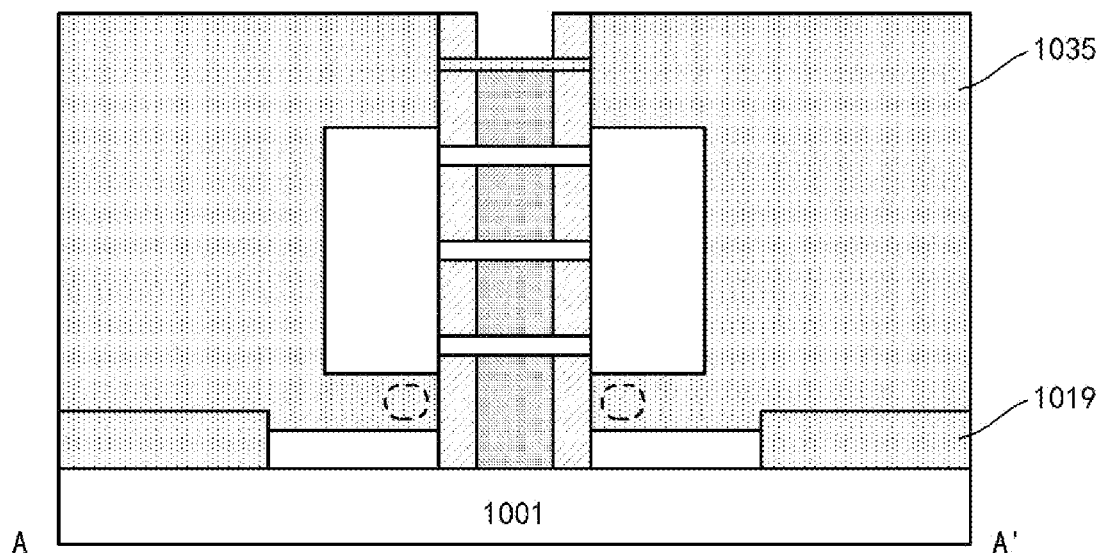

In addition, in the case shown in FIG. 9(b) described above, the interlayer dielectric layer 1035 may also be filled between the source/drain layer and the substrate, as shown in FIG. 10(c), which may facilitate reducing a leakage current. In addition, a filling process may be controlled so that the interlayer dielectric layer 1035 may form a hole between the source/drain layer and the substrate, as shown by a dotted line in FIG. 10(c), which may facilitate reducing a capacitance between the source/drain layer and the substrate.

In order to perform the replacement gate process, the dummy gate, i.e., all the gate defining layers, needs be removed and replaced with the gate stack. Here, in consideration of a formation of an isolation portion below the lowermost gate defining layer 1007, the isolation portion defining layer 1003 may be processed first. Specifically, the isolation portion defining layer 1003 may be replaced with the isolation portion. To this end, a processing channel to the isolation portion defining layer 1003 may be formed.

For example, a height of a top surface of the gate defining layer 1021 may be reduced to be lower than a height of a top surface of the isolation portion defining layer 1003 by selective etching, but a certain thickness of the gate defining layer 1021 still remains, so that a mask layer formed subsequently (referring to 1037 in FIG. 11(*a*) and FIG. 11(*b*)) may mask all the gate defining layers 1007, 1011, 1015 above the top surface of the isolation portion defining layer 1003 while exposing the isolation portion defining layer 1003. For example, an etching depth may be controlled well by using ALE. Here, other gate defining layers 1007, 1011, 1015 may not be affected due to an existence of the etch stop layer 1019'.

Figure 11A:
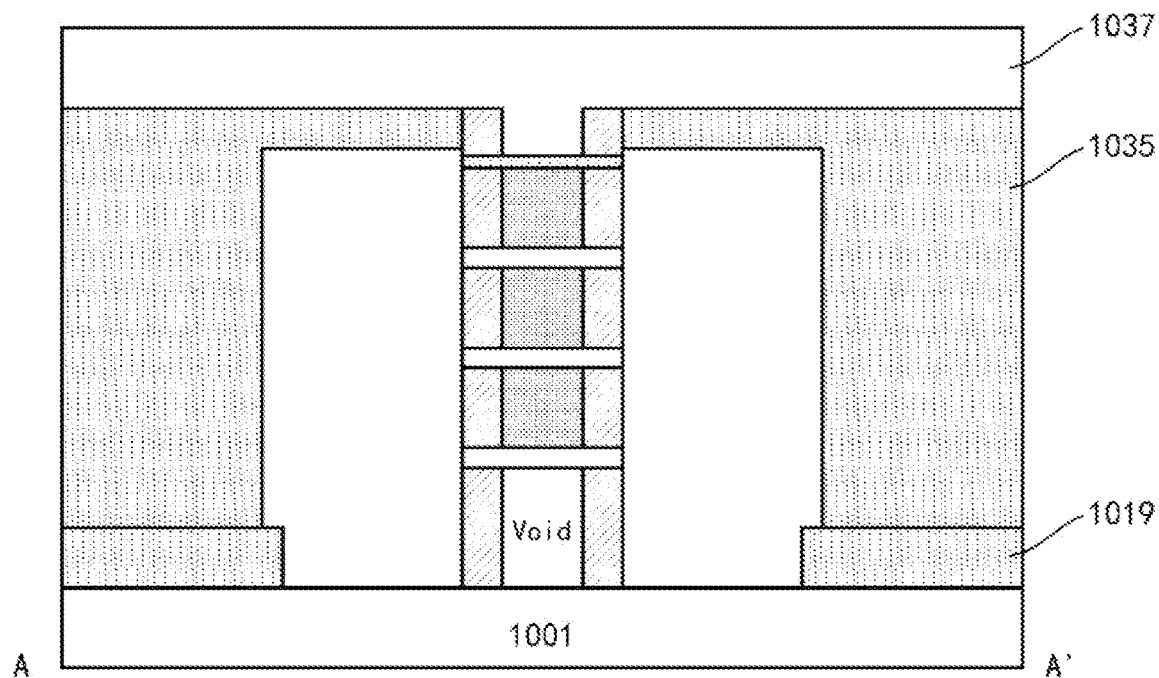
Figure 11B:
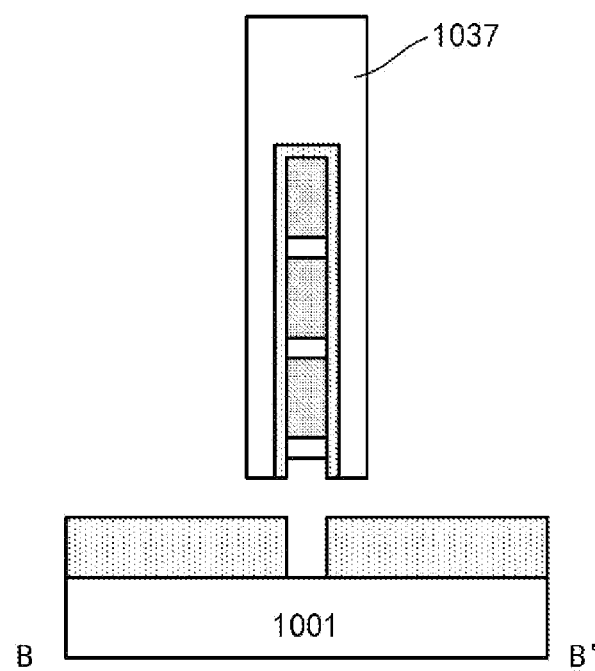

Then, as shown in FIG. 11(*a*) and FIG. 11(*b*), a mask layer such as a photoresist 1037 may be formed on the gate defining layer 1021. The photoresist 1037 may be patterned by photolithography into a strip shape extending in an extension direction of the nanowire/nanosheet, and may mask outer surfaces of the nanowire/nanosheet and the gate defining layers 1007, 1011, 1015 (with the etch stop layer 1019' therebetween). Due to an existence of the gate defining layer 1021, part of a surface of the isolation portion defining layer 1003 is not masked by the photoresist 1037. After that, a selective etching may be performed to sequentially remove the gate defining layer 1021, a portion of the etch stop layer 1019' exposed by a removal of the gate defining layer 1021, and the isolation portion defining layer 1003 exposed by a removal of the portion of the etch stop layer 1019'. Therefore, a void is formed below the etch stop layer 1005. As the isolation portion defining layer 1003 and the nanowires/nanosheets and the gate defining layers that are located above are defined by the same hard mask layer, the isolation portion defining layer 1003 may be aligned with the nanowires/nanosheets and the gate defining layers that are located above in the vertical direction. Accordingly, the void formed by the removal of the isolation portion defining layer 1003 may be self-aligned with the nanowires/nanosheets and the gate defining layers that are located above. After that, the photoresist 1037 may be removed.

Figure 12A:
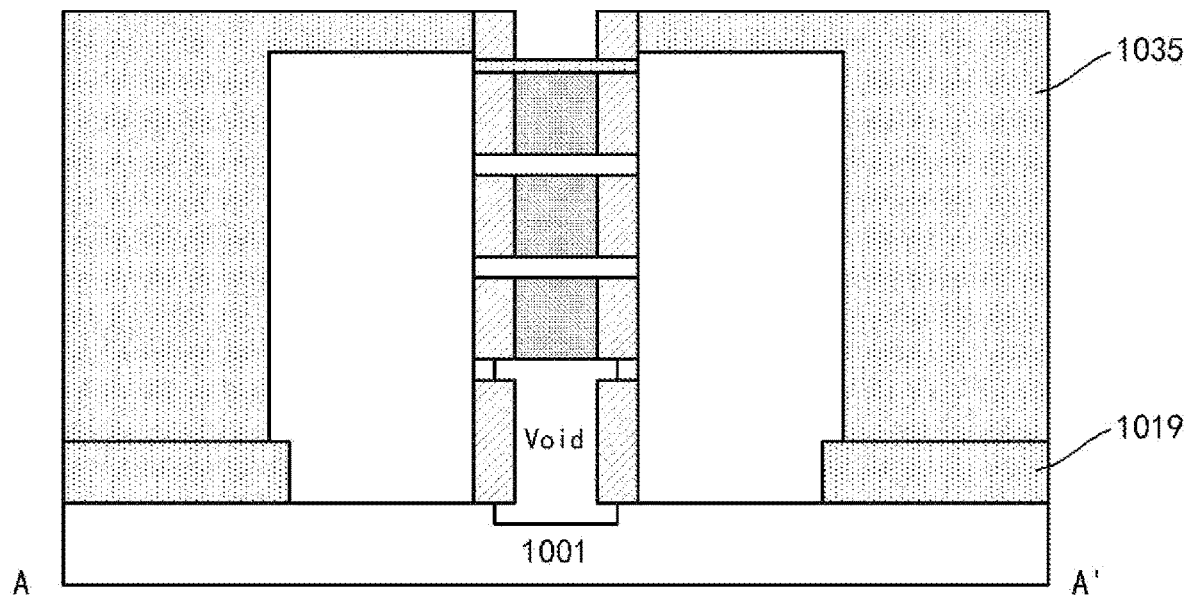
Figure 12B:
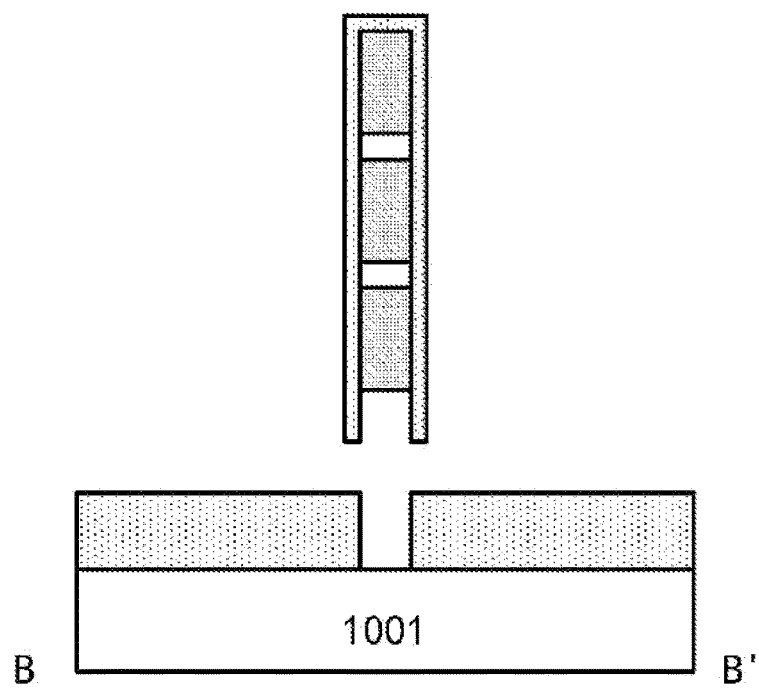

In the example, the etch stop layer 1005 may also contain a semiconductor material and is connected between opposite source/drain layers, which may result in a leakage path. To this end, as shown in FIG. 12(*a*) and FIG. 12(*b*), the etch stop layer 1005 may be cut off between the opposite source/drain layers by selective etching, such as wet etching using a TMAH solution. End portions of the etch stop layer 1005 may be remained so as not to affect the source/drain layers on both sides. Moreover, the remained end portions of the etch stop layer 1005 may not extend to an inner side of the spacer so as not to be in contact with the gate defining layer (which is subsequently replaced with the gate stack) on the inner side of the spacer. That is, an inner sidewall of the remained etch stop layer 1005 may be recessed relative to an inner sidewall of the spacer. As the etching starts from the middle, opposite ends of the remained etch stop layer 1005 may be substantially symmetrical. In addition, in the example, both the etch stop layer 1005 and the substrate 1001 contain silicon, so that the substrate 1001 may also be partially etched away. Therefore, a void between the lowermost gate defining layer 1007 and the substrate 1001 may be enlarged, but the void may still be kept substantially aligned with the nanowires/nanosheets and the gate defining layers that are located above.

Figure 13A:
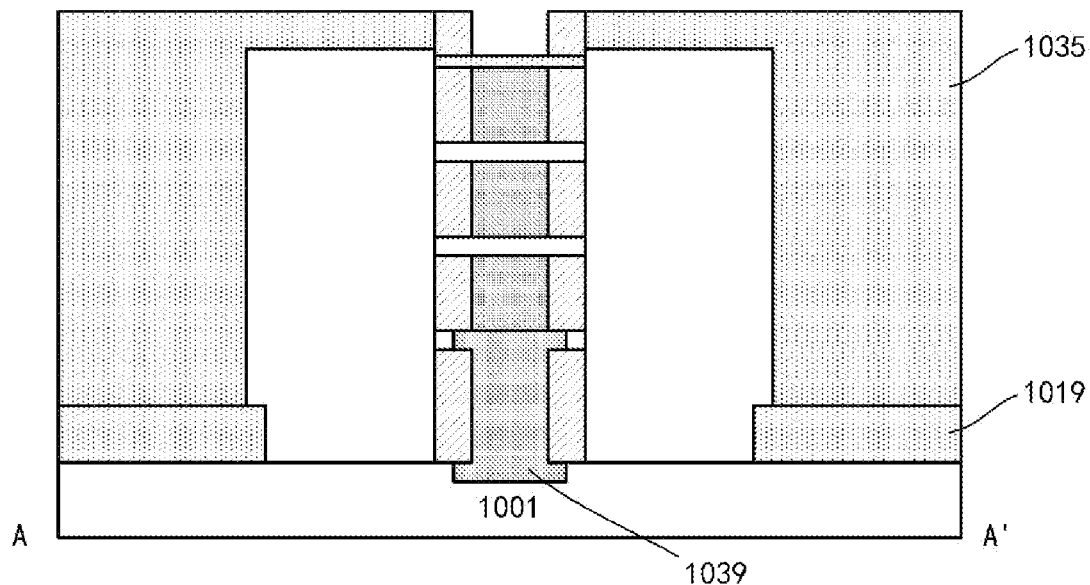
Figure 13B:
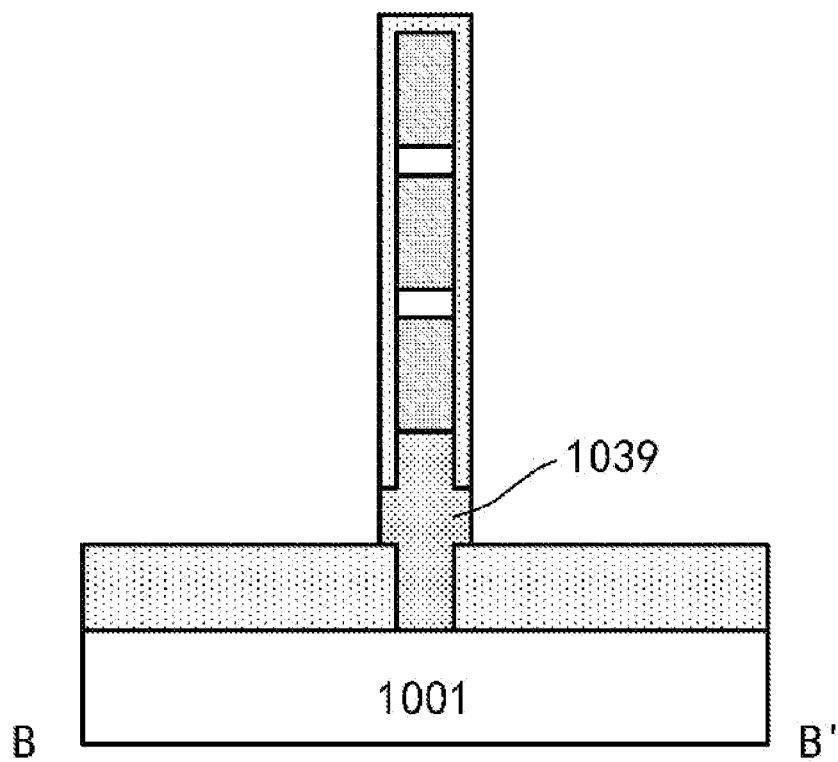

As shown in FIG. 13(*a*) and FIG. 13(*b*), the void thus formed may be filled with a dielectric material, such as a low-k dielectric material, to form an isolation portion 1039. A material of the isolation portion 1039, such as a nitrogen oxide (e.g., silicon oxynitride), may have etching selectivity relative to the STI 1019. For example, the isolation portion 1039 may be formed by depositing a sufficient nitrogen oxide on the substrate 1001 and etching back the deposited nitrogen oxide by, for example, RIE. The isolation portion 1039 thus formed may be self-aligned with the nanowires/nanosheets and the gate defining layers that are located above.

Figure 14A:
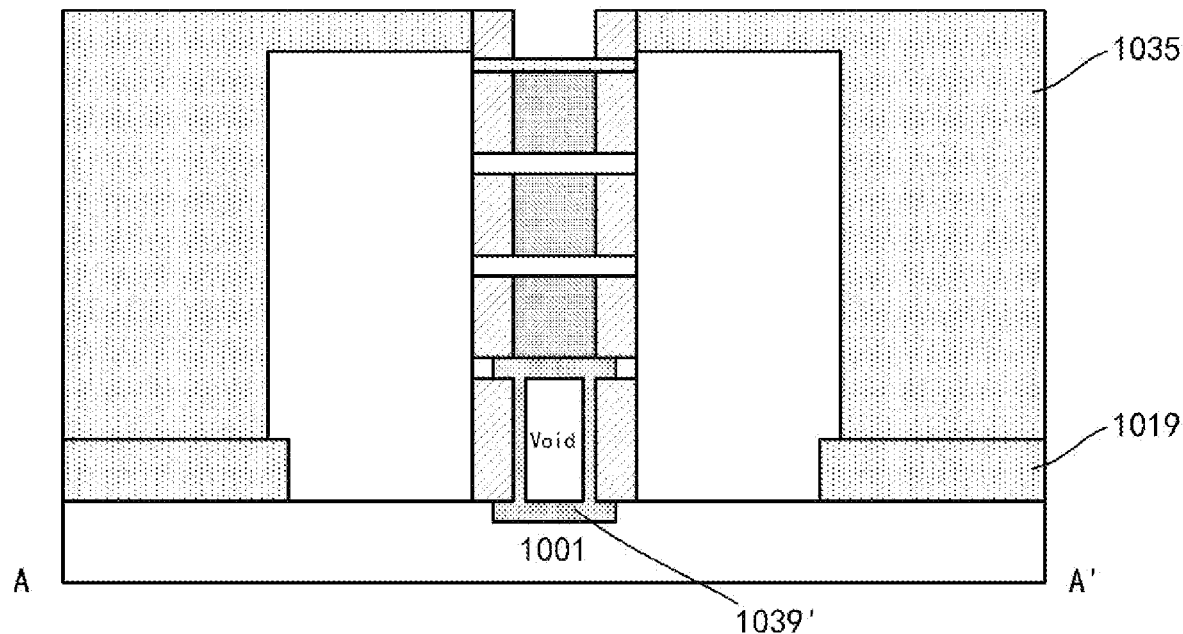
Figure 14B:
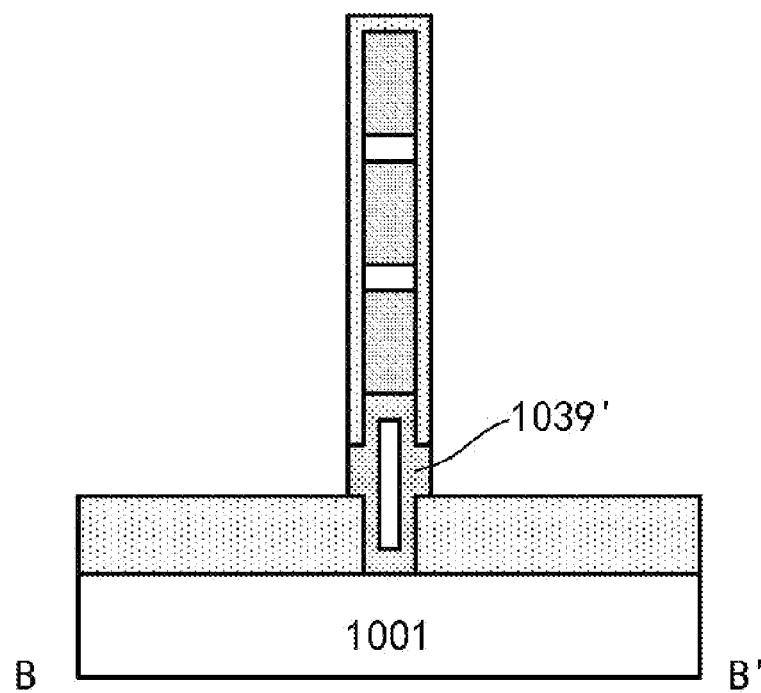

According to other embodiments, as shown in FIG. 14(*a*) and FIG. 14(*b*), when the dielectric material is deposited, an isolation portion 1039' may form a hollow structure due to a space limitation of the above-mentioned void. In this case, a dielectric constant of the isolation portion 1039' may be further reduced.

Figure 15A:
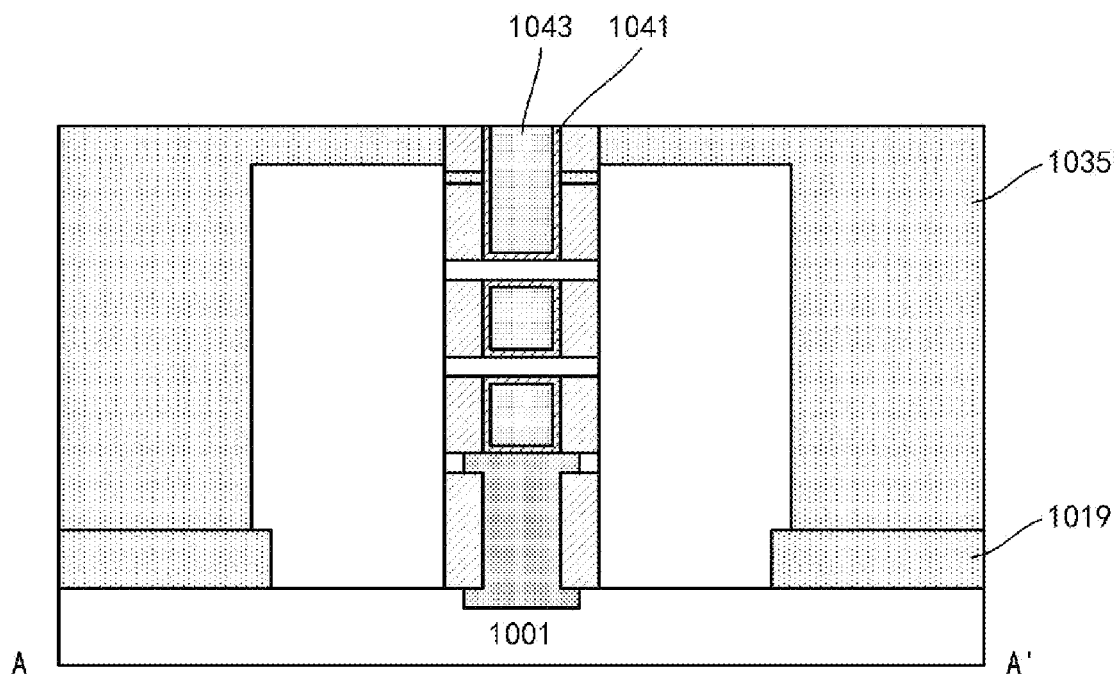
Figure 15B:
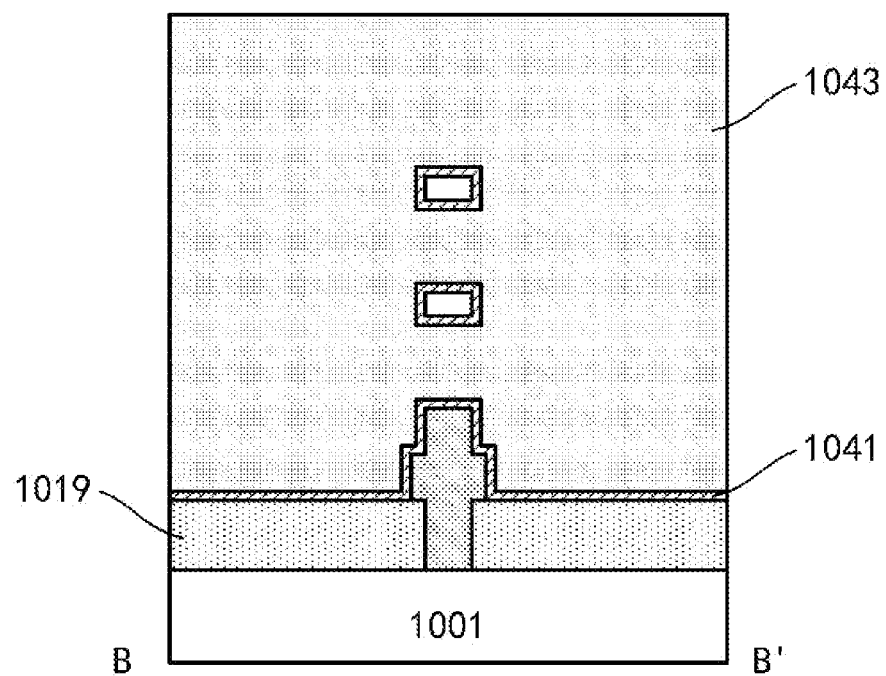

Next, as shown in FIG. 15(*a*) and FIG. 15(*b*), the thin etch stop layer 1019' may be removed by selective etching, so as to expose the gate defining layer, and the gate defining layer may be further removed by selective etching. Thus, a gate trench (corresponding to a space originally occupied by each gate defining layer) may be formed above the STI 1019 and the isolation portion 1039 on the inner side of the spacer 1027. A gate dielectric layer 1041 and a gate electrode 1043 may be sequentially formed in the gate trench thus formed, so as to obtain a final gate stack. For example, the gate dielectric layer 1041 may contain a high-k gate dielectric such as $HfO_2$ with a thickness in a range of about 2 nm to 10 nm; the gate electrode 1043 may include a work function adjustment layer such as TiN, TiAlN, TaN, etc. and a gate conductor layer such as W, Co, Ru, etc. Before the high-k gate dielectric is formed, an interface layer, for example, an oxide formed by an oxidation process or deposition such as Atomic Layer Deposition (ALD) with a thickness in a range of about 0.3 nm to 2 nm, may be formed.

As shown in FIG. 15(*a*) and FIG. 15(*b*), the nanowire/nanosheet device according to embodiments may include the nanowires/nanosheets 1009, 1013 (the number thereof may be less or more) spaced apart from the substrate 1001 and the gate stack surrounding the nanowires/nanosheets 1009, 1013. The gate stack includes the gate dielectric layer 1041 and the gate electrode 1043.

The spacer 1027 is formed on a sidewall of the gate stack. Inner sidewalls of the spacer 1027 may be substantially coplanar in the vertical direction, so as to provide a same gate length. In addition, outer sidewalls of the gate spacer 1027 may also be coplanar in the vertical direction, and may be coplanar with the sidewalls of nanowires/nanosheets 1009, 1013.

The nanowire/nanosheet device may further include the isolation portion 1039. As described above, the isolation portion 1039 may be self-aligned with the gate stack or the nanosheets 1009, 1013, and then at least part of each sidewall of the isolation portion 1039 may be aligned with the corresponding sidewall of the gate stack located above in the vertical direction. For example, as shown in FIG. 15(*a*), at least a middle portion of each of the opposite sidewalls of the isolation portion 1039 in an extension direction (the horizontal direction in the drawing) of the nanowire/nanosheet may be aligned in the vertical direction with a corresponding sidewall of the gate stack. In addition, as shown in FIG. 15(*b*), at least an upper portion of each of the opposite sidewalls of the isolation portion 1039 in an extension direction (the horizontal direction in the drawing) of the gate may be aligned in the vertical direction with a corresponding sidewall (at an interface between the gate stack and the nanowire/nanosheet) of the gate stack. A portion (if existing, which is formed by a process and may not exist depending on the process) of each sidewall of the isolation portion 1039 not coplanar with a corresponding sidewall of the gate stack may extend substantially conformally with the corresponding sidewall of the gate stack.

The spacer 1027 may also be formed on the sidewall of the isolation portion 1039. An upper portion of the isolation portion 1039 may be between upper and lower portions of the spacer 1027, but does not extend beyond the outer sidewall of the spacer 1027.

As described above, the isolation portion 1039 is aligned with the nanowires/nanosheets 1009, 1013 in the vertical direction. In addition, as shown in FIG. 15(*b*), the isolation portion 1039 adjoins the STI 1019 on opposite sides in the extension direction (a horizontal direction in FIG. 15(*b*)) of the gate, so that the gate stack is isolated from the substrate by both the isolation portion 1029 and the STI 1019. The STI 1019 under the gate stack may also be self-aligned with the gate stack, because the STI 1019 under the gate stack may be patterned to be remained under the dummy gate (and subsequently replaced with the gate stack) by a dummy gate patterning process described above in combination with FIG. 5(*a*) and FIG. 5(*b*).

The nanowire/nanosheet device according to embodiments of the present disclosure may be applied to various electronic apparatuses. For example, an Integrated Circuit (IC) may be formed based on the nanowire/nanosheet device, and thus an electronic apparatus may be constructed. Accordingly, the present disclosure further provides an electronic apparatus including the nanowire/nanosheet device as described above. The electronic apparatus may further include a display screen cooperating with the integrated circuit, a wireless transceiver cooperating with the integrated circuit, and other components. For example, the electronic apparatus may include a smart phone, a computer, a tablet computer, a wearable intelligent apparatus, an artificial intelligence apparatus, and a mobile power supply, etc.

According to embodiments of the present disclosure, a method of manufacturing a System on Chip (SoC) is further provided. The method may include the method as described above. In particular, various devices may be integrated on the chip, at least some of which are manufactured according to the method of the present disclosure.

In the above descriptions, technical details such as patterning and etching of each layer have not been described in detail. However, those skilled in the art should understand that various technical means may be used to form layers, regions, etc. of desired shapes. In addition, in order to form the same structure, those skilled in the art may further design a method that is not completely the same as the method as described above. In addition, although the embodiments are described above separately, this does not mean that the measures in the embodiments may not be advantageously used in combination.

Embodiments of the present disclosure have been described above. However, these embodiments are for illustrative purposes only, and are not used to limit the scope of the present disclosure. The scope of the present disclosure is defined by the appended claims and their equivalents. Without departing from the scope of the present disclosure, those skilled in the art may make various substitutions and modifications, and these substitutions and modifications should all fall within the scope of the present disclosure.

What is claimed is:

1. A nanowire/nanosheet device, comprising:
   a substrate;
   a nanowire/nanosheet spaced apart from a surface of the substrate and extending in a first direction;
   a gate stack extending in a second direction to surround the nanowire/nanosheet, wherein the second direction intersects the first direction;
   a first spacer formed on a sidewall of the gate stack;
   source/drain layers at opposite ends of the nanowire/nanosheet in the first direction and adjoining the nanowire/nanosheet; and
   a first isolation portion between the gate stack and the substrate,
   wherein the first isolation portion is self-aligned with the gate stack, and
   wherein a second spacer is further formed on a sidewall of the first isolation portion in the first direction, and the first spacer on the sidewall of the gate stack adjacent to the first isolation portion is spaced apart from the second spacer on the sidewall of the first isolation portion.

2. The nanowire/nanosheet device according to claim 1, wherein the first isolation portion is substantially aligned with the nanowire/nanosheet in a vertical direction.

3. The nanowire/nanosheet device according to claim 1, wherein at least part of each sidewall of the first isolation portion in the first direction and the second direction is substantially aligned in a vertical direction with a corresponding sidewall of the gate stack.

4. The nanowire/nanosheet device according to claim 1, wherein the first isolation portion further extends, in the first direction, to a top surface of a portion of the second spacer on the sidewall of the first isolation portion.

5. The nanowire/nanosheet device according to claim 4, wherein a spaced distance between the second spacer on the sidewall of the first isolation portion and the first spacer on the sidewall of the gate stack is substantially uniform in a vertical direction.

6. The nanowire/nanosheet device according to claim 4, further comprising: a semiconductor material layer between the second spacer on the sidewall of the first isolation portion and the first spacer on the sidewall of the gate stack, wherein the semiconductor material layer is on an outer side of the first isolation portion in the first direction.

7. The nanowire/nanosheet device according to claim 1, wherein the first isolation portion has a hollow structure.

8. The nanowire/nanosheet device according to claim 1, further comprising:
   a second isolation portion adjoining the first isolation portion on opposite sides of the first isolation portion in the second direction.

9. The nanowire/nanosheet device according to claim 1, wherein a sidewall of the first spacer facing away from the gate stack is substantially aligned in a vertical direction with a sidewall of the nanowire/nanosheet.

10. The nanowire/nanosheet device according to claim 1, wherein sidewalls of the first spacer facing the gate stack are substantially aligned with each other in a vertical direction.

11. The nanowire/nanosheet device according to claim 1, wherein a plurality of nanowires/nanosheets are provided, and the nanowires/nanosheets extend substantially parallel to each other, and the nanowires/nanosheets are substantially aligned with each other in a vertical direction.

12. The nanowire/nanosheet device according to claim 1, wherein the source/drain layer adjoins the substrate.

13. The nanowire/nanosheet device according to claim 1, wherein the source/drain layer is spaced apart from the substrate through a dielectric material.

14. The nanowire/nanosheet device according to claim 13, wherein a hole is in the dielectric material between the source/drain layer and the substrate.

15. A method of manufacturing a nanowire/nanosheet device, wherein the nanowire/nanosheet device comprises:
   a substrate;

a nanowire/nanosheet spaced apart from a surface of the substrate and extending in a first direction;

a gate stack extending in a second direction to surround the nanowire/nanosheet, wherein the second direction intersects the first direction;

a first spacer formed on a sidewall of the gate stack;

source/drain layers at opposite ends of the nanowire/nanosheet in the first direction and adjoining the nanowire/nanosheet; and a first isolation portion between the gate stack and the substrate, wherein the first isolation portion is self-aligned with the gate stack, and wherein a second spacer is further formed on a sidewall of the first isolation portion in the first direction, and the first spacer on the sidewall of the gate stack adjacent to the first isolation portion is spaced apart from the second spacer on the sidewall of the first isolation portion, the method comprising:

forming an isolation portion defining layer on a substrate;

providing a nanowire/nanosheet on the isolation portion defining layer, wherein the nanowire/nanosheet extends in a first direction and is spaced apart from the isolation portion defining layer;

patterning the isolation portion defining layer into a shape self-aligned with the nanowire/nanosheet;

forming a dummy gate on the substrate, wherein the dummy gate extends in a second direction intersecting the first direction and surrounds the nanowire/nanosheet;

forming a spacer on a sidewall of the dummy gate;

replacing the isolation portion defining layer with a first isolation portion; and removing the dummy gate, and forming, on an inner side of the spacer, a gate stack in a gate trench formed by a removal of the dummy gate.

16. The method according to claim 15, wherein the providing a nanowire/nanosheet comprises:

forming, on the isolating portion defining layer, a stack of one or more gate defining layers and one or more nanowire/nanosheet defining layers alternately arranged;

patterning the stack and the isolation portion defining layer as a preliminary nanowire/nanosheet extending in the first direction;

forming another gate defining layer on the substrate to cover the stack and the isolation portion defining layer;

patterning the another gate defining layer into a strip shape extending in the second direction; and patterning the stack into a wire shape or a sheet shape by using the strip-shaped another gate defining layer as a mask, wherein the nanowire/nanosheet defining layer patterned into the wire shape or the sheet shape forms the nanowire/nanosheet, and wherein the patterning the isolation portion defining layer into a shape self-aligned with the nanowire/nanosheet comprises patterning the isolation portion defining layer by using the strip-shaped another gate defining layer as the mask.

17. The method according to claim 16, further comprising:

forming a second isolation portion to surround the stack and the isolation portion defining layer that are patterned as the preliminary nanowire/nanosheet, wherein the another gate defining layer is formed on the second isolation portion.

18. The method according to claim 16, wherein the forming a dummy gate comprises: selectively etching the isolation portion defining layer and the gate defining layer, so that sidewalls of the isolation portion defining layer and the gate defining layer are recessed inward relative to a sidewall of the nanowire/nanosheet, wherein the gate defining layer forms the dummy gate, and wherein the forming a spacer comprises: forming the spacer in the recess.

19. The method according to claim 18, further comprising:

forming an etch stop layer on the isolation portion defining layer, wherein the stack is formed on the etch stop layer, wherein the method further comprises: after forming the spacer, forming, on opposite sides of the nanowire/nanosheet in the first direction, source/drain layers adjoining the nanowire/nanosheet;

removing, by a selective etching, the isolation portion defining layer from opposite sides of the nanowire/nanosheet in the second direction;

removing a middle portion of the etch stop layer by the selective etching; and filling a dielectric material in a space caused by a removal of the isolation portion defining layer and the middle portion of the etch stop layer, so as to form the first isolation portion.

20. The method according to claim 19, wherein the first isolating portion has a hollow structure.

21. The method according to claim 19, wherein the source/drain layers are formed by an epitaxial growth from opposite sidewalls of the nanowire/nanosheet in the first direction, and the source/drain layers adjoin the substrate or are spaced apart from the substrate.

22. The method according to claim 21, wherein the source/drain layers are spaced apart from the substrate, the method further comprises: filling a dielectric material between the source/drain layers and the substrate, wherein the dielectric material has a solid or hollow structure.

23. An electronic apparatus, comprising the nanowire/nanosheet device according to claim 1.

24. The electronic apparatus according to claim 23, wherein the electronic apparatus comprises a smart phone, a computer, a tablet computer, a wearable intelligent apparatus, an artificial intelligence apparatus, and a mobile power supply.

* * * * *